United States Patent [19]
Liu et al.

[11] Patent Number: 6,112,005
[45] Date of Patent: Aug. 29, 2000

[54] FILTER DEVICE FOR USE WITH LIGHT AND METHOD MAKING THE SAME

[75] Inventors: Yugiao Liu, Sunnyvale; Paisheng Shen, Fremont; Peter C. Chang, Mountain; Zhong Ming Mao, Santa Clara, all of Calif.

[73] Assignee: Alliance Fiber Optics Products, Inc., Sunnyvale, Calif.

[21] Appl. No.: 09/182,099

[22] Filed: Oct. 27, 1998

Related U.S. Application Data

[60] Provisional application No. 60/065,341, Nov. 12, 1997.

[51] Int. Cl.$^7$ .................... G02B 6/10; G02B 5/28
[52] U.S. Cl. .................. 385/130; 385/129; 385/131; 359/589; 359/590
[58] Field of Search .................. 385/129, 130, 385/131, 132, 141, 147; 359/589, 590, 568, 498

[56] References Cited

U.S. PATENT DOCUMENTS

| | | | |
|---|---|---|---|
| 4,963,844 | 10/1990 | Konishi et al. | 333/208 |
| 5,687,263 | 11/1997 | Kasa et al. | 385/31 |
| 5,726,805 | 3/1998 | Kaushik et al. | 359/589 |
| 5,872,655 | 2/1999 | Seddon et al. | 359/588 |

*Primary Examiner*—Brian Healy

[57] ABSTRACT

A filtering assembly includes a first substrate piece and a second substrate piece combined together with their dielectric band-pass filter-film adhered to each other in a face-to-face manner. A corresponding method for making the same includes following steps: (1) providing a raw substrate having at least a twice dimension of final assembly; (2) coating a designated dielectric band-pass filter-film on one side of said raw substrate; (3) dividing said coated substrate into two semi-finished substrate pieces with said filter-film thereon; (4) combining these two semi-finished substrate pieces together wherein said filter-film of one piece is directly adhered to that of another piece by a thin adhesive optical coupling layer, so that the filtering assembly has said filtering means sandwiched between said two substrates.

4 Claims, 2 Drawing Sheets

Typical transmission property of a single-cavity multilayer dielectric filter

Typical transmission property of a double-cavity multilayer dielectric filter

FILTER DEVICE FOR USE WITH LIGHT AND METHOD MAKING THE SAME

This is a non-provisional application of the provisional application Ser. No. 60/065,341 filed Nov. 12, 1997.

BACKGROUND OF THE INVENTION

1. Field of The invention

The invention relates to an optical band-pass filter device for use with the light, and particularly to the filter assembly and the method making the same.

2. The Related Art

Generally speaking, the common light occupies a wide band on its corresponding optical wavelength range. Oppositely, in the optical field, a light having very narrow range wavelength in a pulse-like or a specific manner is desired due to its capability of controlling and expectation. Therefore, an optical band-pass filter device is used to narrow the range of the wavelength of a designated light for achievement of an output light having a pulse-like character with the relation between its wavelength and intensity. Such characterized light has substantially a useful characteristic to be applied to many matters such as testing or transmission in the optical industry.

As well known, one type of optical band-pass filter is the dielectric-coating cavity filter (including single-cavity and multiple-cavity filter) which is a Fabry-Perot interferometer made with thin films. The cavity layer, namely the cavity, is a spacer layer which has an optical thickness equal to one half (or an integral multiple of one half) the wavelength of the light to be transmitted by the filter. The cavity layer is sandwiched between two reflecting quarter-wave stacks which are made up of alternating high and low index layers, each layer having an optical thickness of one fourth of the passband center wavelength. The typical single-cavity filter in the prior art is constructed by coating successively on a substrate a filter-film composed of filter-layers with alternating high and low refraction index as in the following form:

(substrate) $(HL)^n(2H)^m(LH)^n$, or (substrate) $(LH)^n(2L)^m(HL)^n$, wherein H refers to a layer of high index material such as $TiO_2$, having an optical thickness of one quarter wavelength; and L refers to a layer of low index material such as $SiO_2$, having an optical thickness of one quarter wavelength. The n and m are integrals indicating the repeated times for the structure in the corresponding parentheses respectively.

The multiple-cavity filter in the prior art is manufactured by successively coating on a substrate a multiple-cavity filter-film of alternating high and low index layers. The multiple-cavity filter-film is composed of several single-cavity filter-films with a coupling layer between every adjacent two single-cavity filter-films. The coupling layer typically has an optical thickness of one fourth of the passband center wavelength plus integrals of quarter center wavelength. It should be pointed out that the multiple-cavity filter is composed by several single-cavity or sub-multiple-cavity filters optically coupled together by the coupling layers, and the shape factor of such a multiple-cavity filter has large difference from that of the composing filters. The shape factor is defined as $\Delta\lambda_{0.01}/\Delta\lambda_{0.5}$, where $\Delta\lambda_{0.5}$ is the bandwidth at 0,5 maximum and $\Delta\lambda_{0.01}$ is the bandwidth at 0.01 maximum. The shape factors of single-, double-, triple- and quadruple-cavity filter typically are 11, 3.5, 2.0 and 1.5. An equivalent filter composed by cascading several optically decoupled single or sub-multiple-cavity filters has its shaped factor approximately equal to the composing filers. Thus there are important differences between these two kinds of filters, and this invention relates to a multiple-cavity optical band-pass filter composed by several single-cavity or sub-multiple-cavity filters optically coupled together by the coupling layers.

The performance of a multiple-cavity dielectric-coating band-pass filter strongly depends on its cavity number. In most applications, the more cavity number there is, the better the performance of the multiple-cavity filter, including higher stop band rejection, more flattened pass-band and faster roll-off speed, as shown in FIGS. 1(A) and 1(B) wherein $\lambda$ represents the wavelength and I represents the intensity.

In fact, to attain a sufficiently reliable output light, in certain conditions, there are nearly one hundred filter-layers with alternating high and low refraction index to be successively coated on the substrate to form a multiple-cavity filter-film for a filtering purpose. Because the filter-layers are coated unto the substrate one by one, it takes time and costs money to implement the whole complete multiple-cavity filter assembly. Additionally, any defective filter layer may cause the whole final assembly impractical, thus resulting in a tough requirement of precision and the related environment during the coating process. It is appreciated that for a nearly one hundred filter-layers assembly, significant time and labor are required for fabrication. In conclusion, direct multiple-cavity coating technique is very difficult in manufacturing.

It is also known that the existing multiple-cavity filter device includes a substrate 100 having a filter-film 102 composed of a plurality of filter-layers coated successively on the first side thereof as shown in FIG. 2, and also generally optionally having one anti-reflective film coated on the second side of the substrate. Based on this structure, the commonly light coming from the first side can be filtered through such multiple-cavity filter and reach the second side to be used as a useful light source for the corresponding optical testing or transmission equipment. It should be understood that generally speaking, the filter-layers should be closely stacked with one another without any significant distance between every two adjacent layers, and thus this is the reason why such multiple-cavity filter-layers are only applied to one side of the substrate rather than to both sides of the substrate.

Because it is difficult to fabricate the multiple-cavity filter with large cavity numbers as mentioned before, an object of the invention is to provide a new structure of the multiple-cavity filter device and the corresponding new method for making the same, whereby the manufacturing time and cost can be significantly reduced.

SUMMARY OF THE INVENTION

According to an aspect of the invention, a preferred method for making a multiple-cavity filter assembly includes following steps (1) preparing a double sized substrate; (2) coating a multiple-cavity filter-film with only half number of designated cavities on one side of the substrate; (3) cutting the coating finished substrate into two pieces; and (4) combining such two similar pieces together under the condition that the coated filter-film of one piece tightly abut against (or optically adhered to) those of the other piece in a face-to-face manner. Therefore, the final multiple-cavity filter assembly includes a first substrate section and a second substrate section with a total required number of filter-layers generally sandwiched therebetween. The structure difference between the prior art device and the preferred assembly is that the middle coupling-layer in the prior art device is replaced by a thin layer of optical adhesives or materials having an optical thickness approximately equal to one fourth (or plus an additional integral multiple of one half) of the passband center wavelength. The procedure to manufacture the preferred assembly and the corresponding product significantly decreases time and labor required in the prior art, and simplifies the complicate coating process for the multiple-cavity filter manufacturing. On the other hand, the defect ratio of the product can be lowered because of the strict symmetry in the preferred method.

DETAILED DESCRIPTION OF THE PREFERRED EMBODIMENTS

Figure 1A:
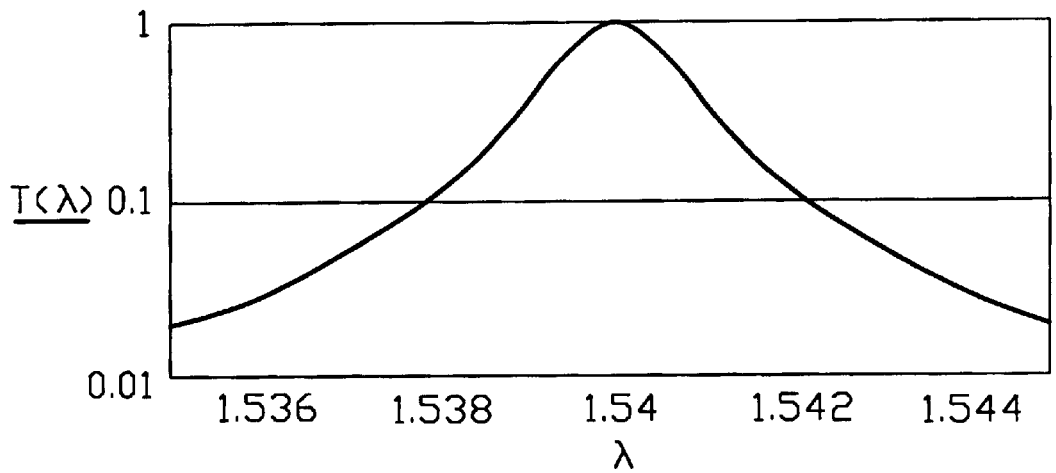
FIG. 1(A) is a diagram to show the typical transmission property of a single-cavity dielectric multilayer optical filter.
Figure 1B:
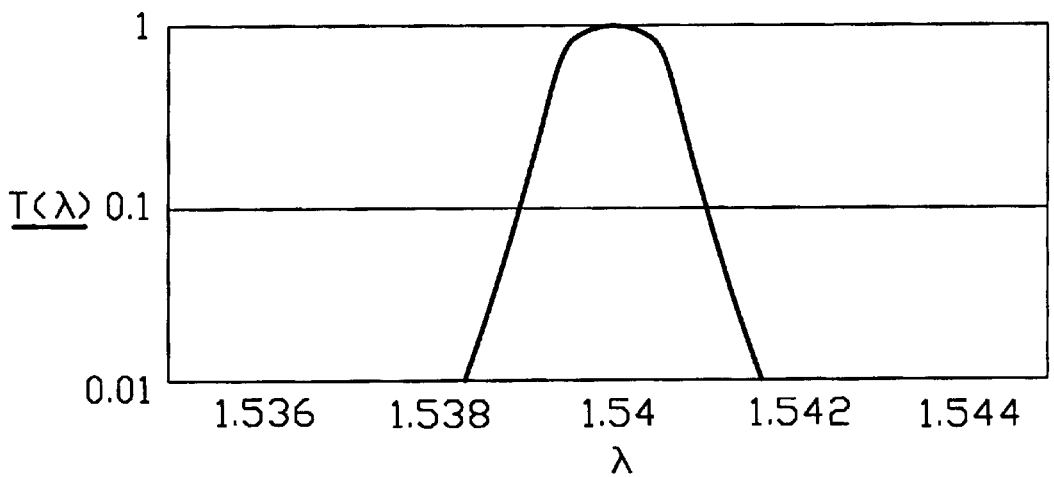
FIG. 1(B). is a diagram to show the typical transmission property of a double-cavity dielectric multilayer optical filter which has a square top in the pass band wavelength range.
Figure 2:
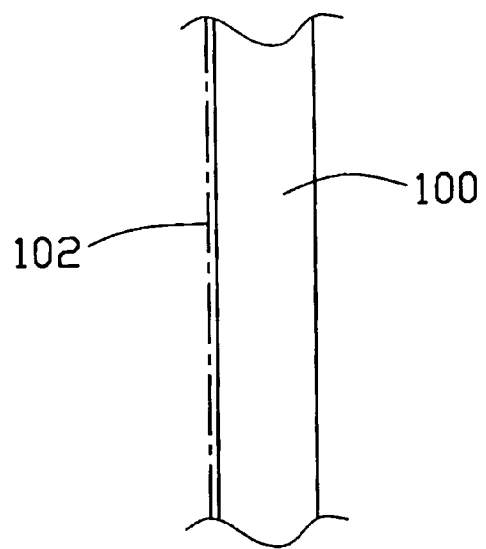
FIG. 2 is a cross-sectional view of a prior art multiple-cavity optical band-pass filter device.
Figure 3:
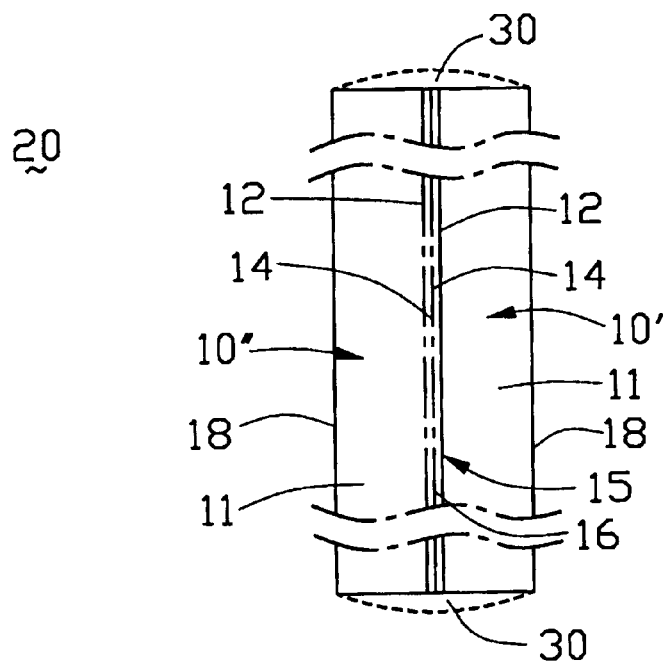
FIG. 3 is a cross-sectional view of a presently preferred embodiment of a multiple-cavity optical band-pass filter device.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention.

It will be noted here that for a better understanding, most of like components are designated by like reference numerals throughout the various figures in the embodiments. The invention includes a new filter assembly and the method of making the same. The method includes the steps as follows. First, a raw substrate 10 is provided which has a double size than the designated one. Successively, a multiple-cavity filter-film 14 with only half number of designated cavities, and composed by a plurality of filter-layers with alternating high and low refraction index are, one by one, coated unto one side surface 12 of the substrate 10. The substrate 10 with the coated filter-film 14 is cut into two similar pieces 10', 10" each including a substrate body 11 and the corresponding filter-film 14, and these two pieces 10' and 10" are side by side tightly combined together as a final filter assembly 20 wherein the filter-film 14 of the piece 10' abuts against (or adheres to)the filter-film 14 of the piece 10' in a face-to-face manner with a thin adhesive optical coupling layer 16 therebetween.

Therefore, the unfiltered common light may enter the filter assembly 20 from the second side surface 18 of the piece 10' and penetrate the piece 10' to the first side surface 12 thereof. The light further penetrates the filter-film 14 coated on the first side surface 12 of the piece 10' and then a thin coupling layer 16 of optical adhesives or materials having an optical thickness substantially equivalent to one fourth (or plus an additional integral multiple of one half) of the passband center wavelength. The light further propagates through the filter-film 14 coated on the first side surface 12 of the other piece 10' aside, and successively passes through the substrate body 11 of the piece 10' to reach the second side surface 18 of the piece 10' and be adapted to be a desired light source for the associated testing or transmission equipment. Understandably, the light, which comes from the second side surface 18 of the piece 10', passes the substrate bodies 11 of the pieces 10', 10", and reach the second side surface 18 of the piece 10", also performs the same filtered effect as well.

It can be noted that the light which penetrates the filter assembly 20 substantially passes through the filter-film 14 of the first piece 10', the filter-film 14 of the second piece 10', and the coupling layer 16 therebetween, so that the input light is substantially affected by such group of filter-films 15. Because the total structure of the filter-layers in the final filter assembly 20 is the equivalent of that of designated multiple-cavity band-pass filter, so that the group of filter-film 15 of the whole assembly 20 is actually the designated multiple-cavity film as the predetermined required one. Therefore, the group of filter-films 15 of the assembly 20 functionally owns the same property/result as those in the prior arts, and the input light can enter from the second side surface 18 of the first piece 10', go through the filter assembly 20 and be filtered by the group of filter-films 15 sandwiched between two substrate bodies 11 of the pieces 10' and 10" of the filter assembly 20. The property of the output light on the second side surface 18 of the second piece 10" which is opposite to the second side surface 18 of the first piece 10', can be formed to be the one as desired.

It can be contemplated that an anti-reflection layer, i.e., an AR coating, may be optionally applied unto the second side surface 18 of the piece 10', 10" as implemented in the prior art, for achievement of a better stable performance of the filtering result.

In conclusion, the invention provides a new method for manufacturing a filter assembly which has a new structure thereof, whereby the manufacturing time and labor can be efficiently saved, and the defectives ratio can be decreased. In summary, complexity and difficulty of making the subject filter device can be lower than those in the prior art.

It can be noted that in the present embodiment, a new structure of the assembly is provided with the filter-film 14 directly coupled with each other by a thin coupling layer 16 of optical adhesive or material. In other words, in the current practice, the filter-film 14 should be closely or tightly one with another applied thereunto for forming as a unitary unit for efficiently and reliably filtering the undesired range of the light wavelength. This is the reason why in the present embodiment, the two half pieces 10' and 10" have to be closely face-to-face combined together with their filter-film 14. It may be expected that anyhow, one of the spirit of the invention is to provide a larger dimensioned raw substrate adapted to be coated on one side surface with a multiple-cavity filter-film 14 having only half number of designated cavities, and successively to be divided into more than one similar pieces wherein two of such pieces are arranged in a closely side by side combined manner to form a final assembly unit, whereby the whole assembly of the filter-film 14 through the coupling layer 16 is functionally the same as the designated multiple-cavity filter-film commonly and successively one another coated on one side surface of one substrate shown in the prior art. It can be noted in this embodiment, the coated substrates are cut into the piece with the desired dimension, and then two of such pieces are face to face fastened to each other on their coated sides for finalizing the final assembly. Alternately, the steps of the fabrication procedure may change their order wherein the adhesive combination of two opposite pieces may be implemented before such pieces have been cut to be their final dimension. Furthermore, in an arrangement of mass production, a plurality of different substrates are provided with multiple-cavity filter-film coated thereon, respectively, and then any two of them are selected to be face to face combined together under the condition that (1) the multiple-cavity filter-film of the first substrate and those of the second substrate should face to face directly abut against with each other whereby the total multiple-cavity filter-film of both the substrates are substantially sandwiched between the first substrate body and the second substrate body with a thin adhesive optical coupling layer therebetween; (2) the total assembly of the filter-films of these selected two substrates are functionally the same as a filter-film in the prior art with cavity number equal to the sum of those of the composite filter-film.

It is also noted that in this embodiment, an air gap may exist between the opposite piece 10' and 10" instead of adhesives or materials to form the coupling layer. In this embodiment, two pieces 10' and 10" can be adhered to each other by glue or other materials 30 on the edge portions.

It should be noted that the filter assembly of the invention can be used with DWDM (Dense Wavelength Division Multiplexing) for either Multiplexer or Demultiplexer.

In conclusion, the spirit of the invention relates to a device consolidating a first substrate with N cavity filter-film on one side thereof and a second substrate with M (wherein M may be equal to or different from N) cavity filter-film on one side thereof under the condition that the filter-film of the first substrate face to face is adhered with those of the second substrate by a thin adhesive optical coupling layer, whereby the whole filter assembly functions as with N+M cavity filter-film.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. A filtering assembly including a first substrate piece and a second substrate piece combined together with their filtering means directly adhered to each other in a face-to-face manner by a thin optical coupling layer therebetween, wherein the substrate pieces comprise:

a substrate with filtering means coated on one side, wherein the filtering means comprise a successively coated multiple-cavity dielectric optical band-pass filter-film having at least one cavity therein.

2. The assembly as defined in claim 1, wherein said thin optical coupling layer is air or adhesive material.

3. An arrangement of a filter assembly, comprising:

a first substrate piece with a first filtering means on one side thereof, wherein the first filtering means comprises a successively coated multiple-cavity dielectric optical bandpass filter-film having at least one cavity therein;

a second substrate piece with a second filtering means on one side thereof, wherein the second filtering means comprises a successively coated multiple-cavity dielectric optical band-pass filter-film having at least one cavity therein;

said first substrate piece and said second substrate piece tightly consolidated with each other under the condition that the filtering means of the first substrate piece is adhered to those of the second substrate piece in a face-to-face manner by a thin optical coupling layer therebetween.

4. The arrangement as defined in claim 3, wherein said thin optical coupling layer is air or adhesive material.

* * * * *

UNITED STATES PATENT AND TRADEMARK OFFICE
CERTIFICATE OF CORRECTION

PATENT NO  : 6,112,005
DATED      : August 29, 2000
INVENTOR(S): Liu et al.

It is certified that error appears in the above-identified patent and that said Letters Patent is hereby corrected as shown below:

On title page, item [75] change "Yugiao" to "Yuqiao".

Signed and Sealed this

Fifteenth Day of May, 2001

Attest:

NICHOLAS P. GODICI

*Attesting Officer*  *Acting Director of the United States Patent and Trademark Office*